US007301212B1

(12) United States Patent
Mian et al.

(10) Patent No.: US 7,301,212 B1
(45) Date of Patent: Nov. 27, 2007

(54) MEMS MICROPHONE

(75) Inventors: Michael Mian, Livermore, CA (US); Robert Drury, Santa Clara, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 462 days.

(21) Appl. No.: 10/909,190

(22) Filed: Jul. 30, 2004

(51) Int. Cl.
*H01L 29/84* (2006.01)

(52) U.S. Cl. ........................ 257/415; 257/416; 257/419

(58) Field of Classification Search ................ 257/415, 257/416, 418, 419
See application file for complete search history.

(56) References Cited

U.S. PATENT DOCUMENTS

2005/0218488 A1* 10/2005 Matsuo ........................ 257/678

OTHER PUBLICATIONS

Karl Behringer, University of Washington, "EE 539 TM/M(S)E 599 TM, Lecture B2, Micro/Nano/MEMS", Spring 2003, [online], [retrieved on Jun. 28, 2004]. Retrieved from the Internet: <URL:http://courses.washington.edu/mengr599/tm_taya/notes/b2.pdf>. pp. 1-10 (unnumbered).

"Microphones", [online], [retrieved on Jun. 8, 2004]. Retrieved from the Internet: <URL:http://hyperphysics.phy-astr.gsu.edu/hbase/audio/mic3.html>. pp. 1-5.

* cited by examiner

*Primary Examiner*—Andy Huynh
*Assistant Examiner*—Thinh T Nguyen
(74) *Attorney, Agent, or Firm*—Mark C. Pickering

(57) ABSTRACT

The sensitivity of a MEMS microphone is substantially increased by using a portion of the package that holds the MEMS microphone as the diaphragm or a part of the diaphragm. As a result, the diaphragm of the present invention is substantially larger, and thus more sensitive, than the diaphragm in a comparably-sized MEMS microphone die.

19 Claims, 5 Drawing Sheets

MEMS MICROPHONE

BACKGROUND OF THE INVENTION

1. Field of the Invention

The present invention relates to a MEMS and, more particularly, to a MEMS microphone.

2. Description of the Related Art

A micro-electromechanical system (MEMS) is a microscopic machine that is fabricated using the same types of steps (e.g., the deposition of layers of material and the selective removal of the layers of material) that are used to fabricate conventional analog and digital CMOS circuits.

For example, one type of MEMS is a microphone. Microphones commonly use a micro-machined diaphragm (a thin layer of material suspended across an opening) that vibrates in response to pressure changes (e.g., sound waves). Microphones convert the pressure changes into electrical signals by measuring changes in the deformation of the diaphragm. The deformation of the diaphragm, in turn, can be detected by changes in the capacitance, piezoresistance, or piezoelectric effect of the diaphragm.

FIG. 1 shows a view that illustrates a prior-art, piezoelectric microphone 100. As shown in FIG. 1, microphone 100 includes a rigid U-shaped back plate 110, a diaphragm 112 that is formed across the opening in back plate 110, and a piezocrystal 114 that is connected between back plate 110 and diaphragm 112.

In operation, changes in air pressure (e.g., sound waves) cause diaphragm 112 to vibrate which, in turn, causes the end of piezocrystal 114 to be pushed and pulled. The pushing and pulling on the end of piezocrystal 114 oppositely charges the two sides of piezocrystal 114. The charges are proportional to the amount of pushing and pulling, and thus can be used to convert pressure waves into electrical signals which can then be amplified.

When a microphone is reduced in size to that of a MEMS, one concern that arises is sensitivity. This is because the size of the diaphragm of a MEMS microphone is so relatively small (e.g., less than a millimeter across), due to being formed across a cavity or a back side opening in a relatively-small semiconductor die.

BRIEF DESCRIPTION OF THE DRAWINGS

FIG. 2A is a plan view, FIG. 2B is a cross-sectional view taken along line 2B-2B of FIG. 2A, and FIG. 2C is a side view.

FIG. 3A is a bottom view of package top 222, while FIG. 3B is a top view of interconnect structure 216.

FIG. 5A is a bottom view of package top 222, FIG. 5B is a top view of interconnect structure 216, and FIG. 5C is a cross-sectional view taken along line 5C-5C of FIG. 5A.

FIG. 6A is a bottom view of package top 222, FIG. 6B is a top view of interconnect structure 216, and FIG. 6C is a cross-sectional view taken along line 2B-2B.

FIG. 7A is a plan view, while FIG. 7B is a cross-sectional view taken along line 7B-7B of FIG. 7A.

DETAILED DESCRIPTION OF THE INVENTION

Figure 1:
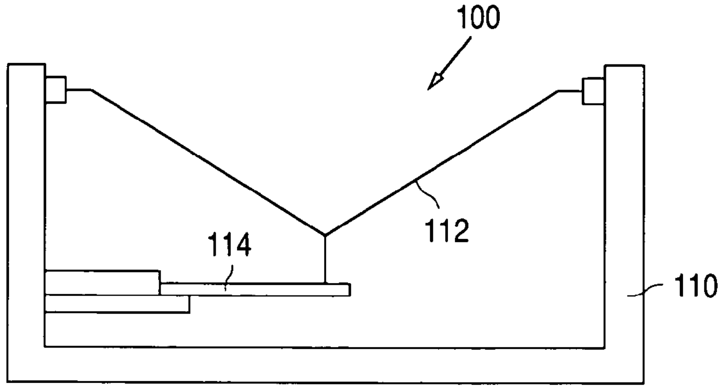
FIG. 1 (PRIOR ART)
FIG. 1 is a diagram illustrating a prior-art, piezoelectric microphone 100.
Figure 2A:
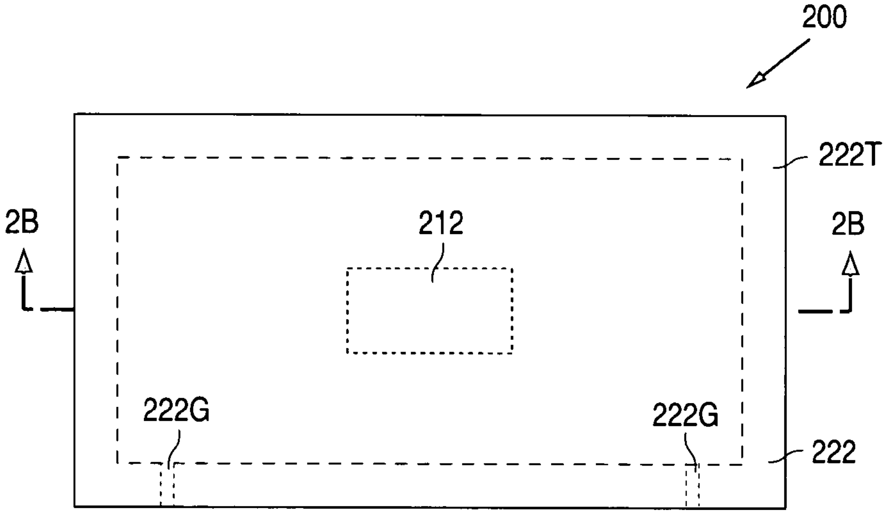
FIGS. 2A-2C are diagrams illustrating an example of a MEMS microphone 200 in accordance with the present invention.
Figure 2B:
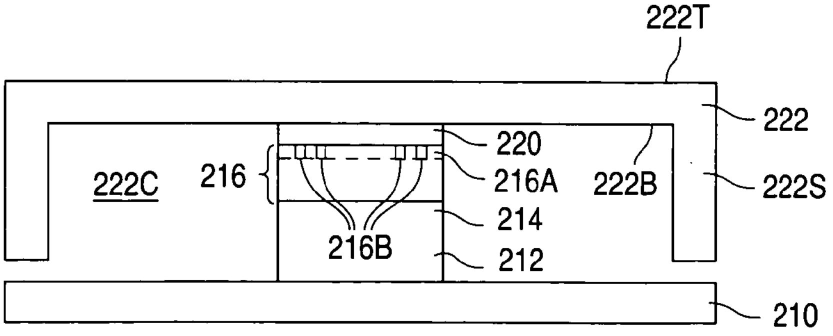
Figure 2C:
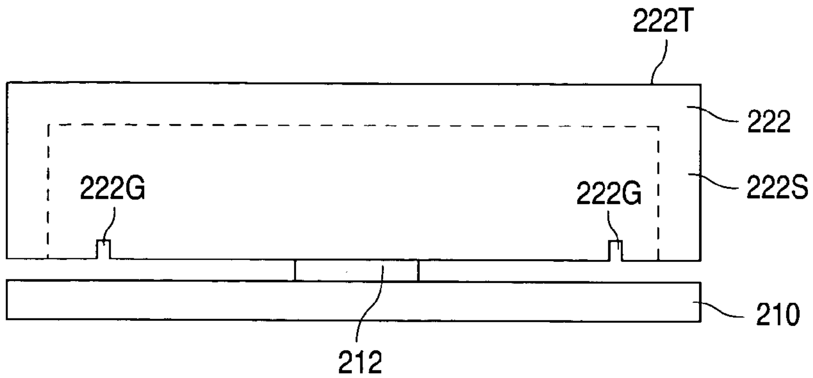

FIGS. 2A-2C show diagrams that illustrate an example of a MEMS microphone 200 in accordance with the present invention. FIG. 2A shows a plan view, FIG. 2B shows a cross-sectional view taken along line 2B-2B of FIG. 2A, and FIG. 2C shows a side view. As described in greater detail below, the present invention utilizes the top surface of the package, which is used to carry the MEMS die, to increase the sensitivity of MEMS microphone 200.

As shown in FIGS. 2A-2C, MEMS microphone 200 includes a package base 210, and a MEMS semiconductor die 212 that is bonded to package base 210. Semiconductor die 212, in turn, includes a semiconductor substrate 214 that has MOS transistors, and an interconnect structure 216 that is connected to the top surface of substrate 214.

Interconnect structure 216, which electrically connects together the MOS transistors to form amplifiers and other devices, includes metal traces, contacts, intermetal vias, a top isolation layer 216A, and a number of surface vias 216B that are formed through top isolation layer 216A to be electrically connected to the structures that lie on the top surface of interconnect structure 216. In addition, the surface vias 216B are electrically connected to the MOS transistors and other devices via the metal traces, contacts, and intermetal vias of interconnect structure 216.

As further shown in FIGS. 2A-2C, microphone 200 also includes a connector 220 that is connected to the top surface of interconnect structure 216, and a package top 222 that is connected to connector 220 to lie over package base 210. Connector 220 can be implemented in a number of different ways, such as with springs or coils, and can be formed from piezoelectric or piezoresistive materials.

Package top 222, in turn, has a top side 222T, a bottom side 222B, and side walls 222S that define an internal cavity 222C. The side walls 222S can optionally include micro-notches or micro-indentations 222G that prevent internal cavity 222C from being completely closed in response to a strong pressure wave.

When used, micro-indentations 222G control the speed with which the pressure within cavity 222C can be equalized with the surrounding pressure after cavity 222C has been closed. For example, micro-indentations 222G can be formed such that the pressure can not be equalized in less than 0.1 seconds (10 Hz). (Although the figures show micro-indentations 222G in only one side wall, any number of micro-indentations 222G in any number of side walls 222S can be used to achieve the desired pressure equalization speed.)

In accordance with the present invention, package top 222 functions either alone, or in combination with connector 220, as the diaphragm of microphone 200. Thus, since package top 222 is substantially larger than the top of semiconductor die 212, package top 222 provides a diaphragm that is substantially more sensitive than the diaphragm of a comparably-sized, prior-art MEMS microphone die.

Figure 3A:
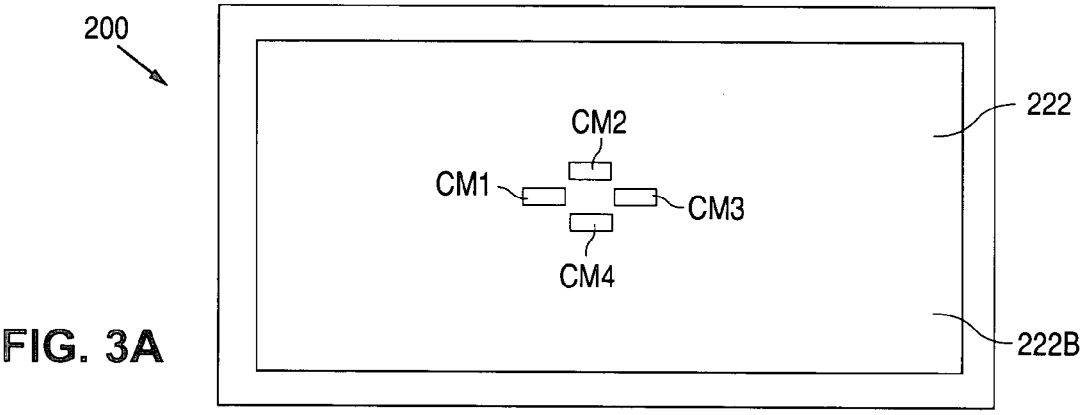
FIGS. 3A-3B are diagrams illustrating an example of a piezo-responsive embodiment of MEMS microphone 200 in accordance with the present invention.
Figure 3B:
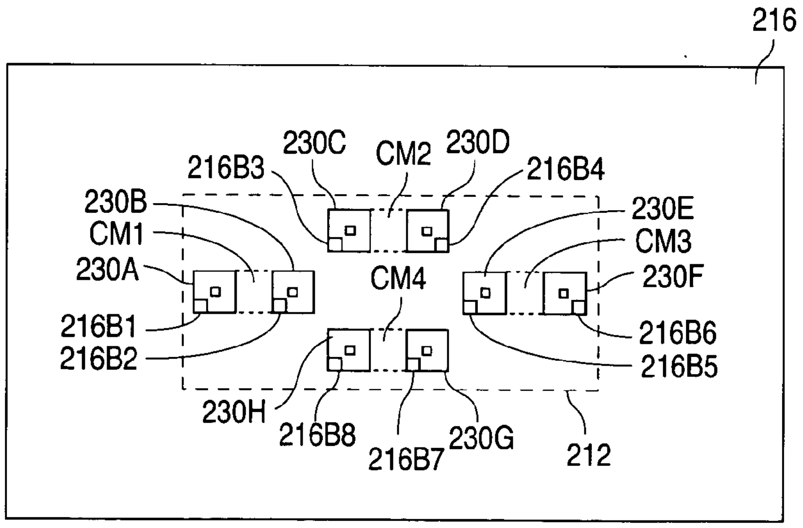

FIGS. 3A-3B show diagrams that illustrate an example of a piezo-responsive embodiment of MEMS microphone 200 in accordance with the present invention. FIG. 3A shows a bottom view of package top 222, while FIG. 3B shows a top view of interconnect structure 216. As shown in FIG. 3A, the bottom side 222B of package top 222 includes four spaced-apart and isolated conductive strips CM1, CM2, CM3, and CM4 that are connected to the bottom side 222B of package top 222.

As shown in the FIG. 3B example, interconnect structure 216 is implemented with eight surface vias 216B1, 216B2, 216B3, 216B4, 216B5, 216B6, 216B7, and 216B8, while connector 220 is implemented with eight piezo-responsive leaf springs 230A, 230B, 230C, 230D, 230E, 230F, 230G, and 230H that are electrically connected to the surface vias 216B1, 216B2, 216B3, 216B4, 216B5, 216B6, 216B7, and 216B8, respectively. (Other types of springs or coils can alternately be used.)

The eight piezo-responsive leaf springs 230A, 230B, 230C, 230D, 230E, 230F, 230G, and 230H, in turn, are connected to the four conductive strips CM1, CM2, CM3, and CM4 that are connected to the bottom side of package top 222. When connected together, leaf springs 230A and 230B contact opposite ends of conductive strip CM1, while leaf springs 230C and 230D contact opposite ends of conductive strip CM2.

Similarly, leaf springs 230E and 230F contact opposite ends of conductive strip CM3, while leaf springs 230G and 230H contact opposite ends of conductive strip CM4. (The eight surface vias, eight leaf springs, and four conductive strips are exemplary, other numbers can alternately be used.)

Figure 4:
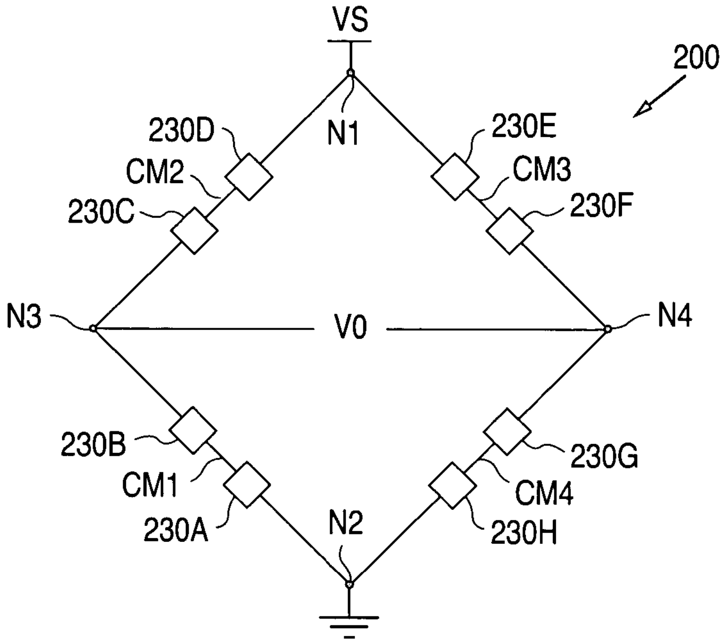
FIG. 4 is a circuit diagram further illustrating the MEMS microphone 200 example in accordance with the present invention.

FIG. 4 shows a circuit diagram that further illustrates the MEMS microphone 200 example in accordance with the present invention. As shown in FIG. 4, piezo-responsive leaf springs 230A-230G can be electrically connected in a Wheatstone Bridge configuration where a sense voltage VS is connected to a first node N1, ground is placed on a second node N2, and an output voltage VO is taken between third and fourth nodes N3 and N4.

In operation, when the pressure changes due to incoming pressure waves, the change in pressure causes package top 222 to vibrate. The vibration causes the piezo-responsive leaf springs 230A, 230B, 230C, 230D, 230E, 230F, 230G, and 230H to change position which, in turn, changes the strain placed on the piezo-responsive leaf springs 230A, 230B, 230C, 230D, 230E, 230F, 230G, and 230H.

The change in strain deforms the band gap structures of the piezo-responsive leaf springs 230A, 230B, 230C, 230D, 230E, 230F, 230G, and 230H. The deformed band gap structures change the mobility and density of the charge carriers which, in turn, changes the resistivity of the piezo-responsive leaf springs 230A, 230B, 230C, 230D, 230E, 230F, 230G, and 230H.

In this example, the changes in resistivity are detected by the Wheatstone Bridge circuit shown in FIG. 4, which then varies the output voltage VO in response to the changes in resistivity. Thus, variations in the output voltage VO directly relate to changes in pressure (e.g., due to sound waves).

One of the advantages of the present invention is that microphone 200, which can be used in audio, ultrasonic, infrasonic, and hydrophonic applications, is substantially more sensitive than a comparably-sized MEMS microphone. This is because package top 222, which functions, in part, as the diaphragm, is substantially larger than the diaphragm of a comparably-sized MEMS microphone die. As a result, microphone 200 can detect much smaller variations in pressure (sound waves).

Alternately, rather than the leaf spring being formed from a piezo-responsive material, such as a piezoelectric or piezoresistive material, one or more leaf springs can be connected to a layer of piezo-responsive material to deform the piezo-responsive material, and alter the electrical response of the material.

Figure 5A:
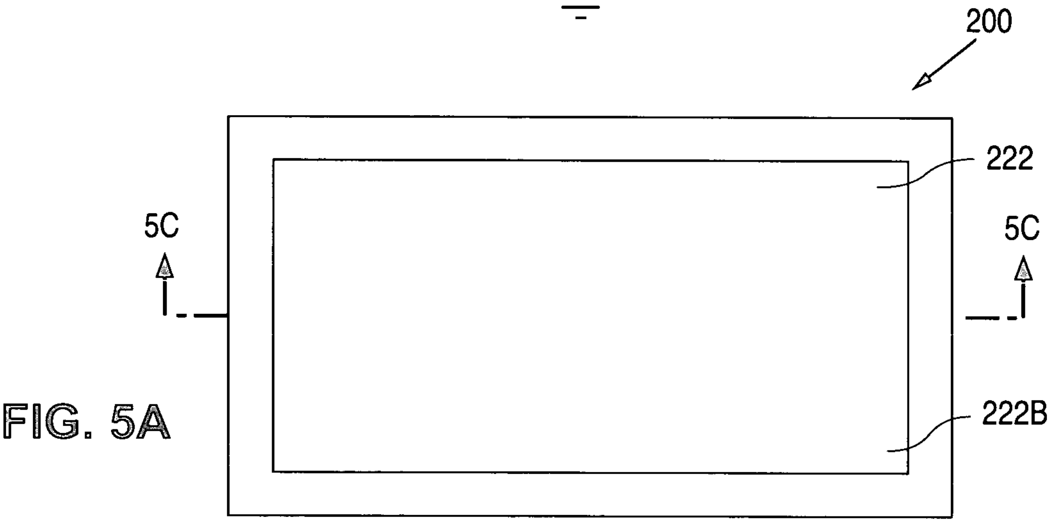
FIGS. 5A-5C are diagrams illustrating another example of a piezo-responsive embodiment of MEMS microphone 200 in accordance with the present invention.
Figure 5B:
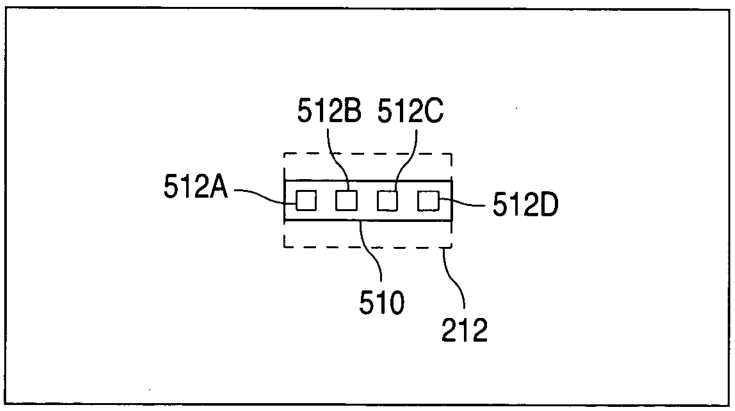
Figure 5C:
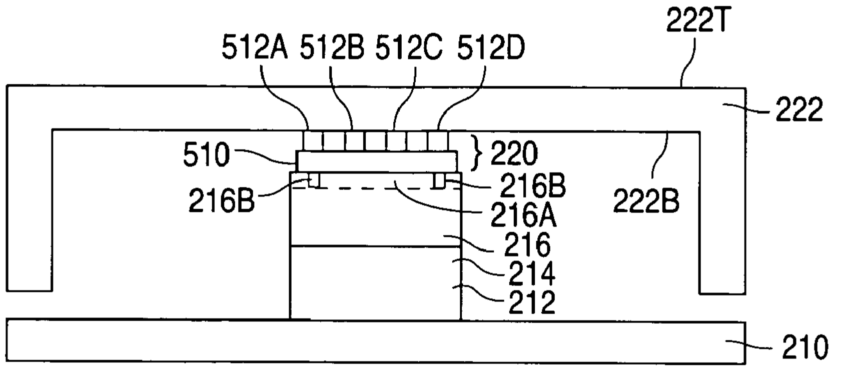

FIGS. 5A-5C show diagrams that illustrate another example of a piezo-responsive embodiment of MEMS microphone 200 in accordance with the present invention. FIG. 5A shows a bottom view of package top 222, FIG. 5B shows a top view of interconnect structure 216, and FIG. 5C shows a cross-sectional view taken along line 5C-5C of FIG. 5A. As shown in FIG. 5A, the bottom side 222B of package top 222 is free of any conductive material.

As shown in the FIGS. 5B and 5C, connector 220 is implemented with a layer of piezo-responsive material 510, and four leaf springs 512A, 512B, 512C, and 512D that are physically connected to the bottom side 222B of package top 222, and to different locations on the top surface of piezo-responsive material 510. Material 510 can be totally formed on top isolation layer 216A, or partially over a cavity, to contact the surface vias 216B. In addition, other types of springs or coils can alternately be used.

In operation, as before, when the pressure changes due to incoming pressure waves, the change in pressure causes package top 222 to vibrate. The vibration causes the leaf springs 512A, 512B, 512C, and 512D to vary the location and amount of pressure that is exerted on piezo-responsive material 510 which, in turn, changes the electrical characteristics of piezo-responsive material 510. Thus, by detecting the change in the electrical characteristic (e.g., voltage or resistivity), the changes in pressure can be converted into an electrical signal.

Figure 6A:
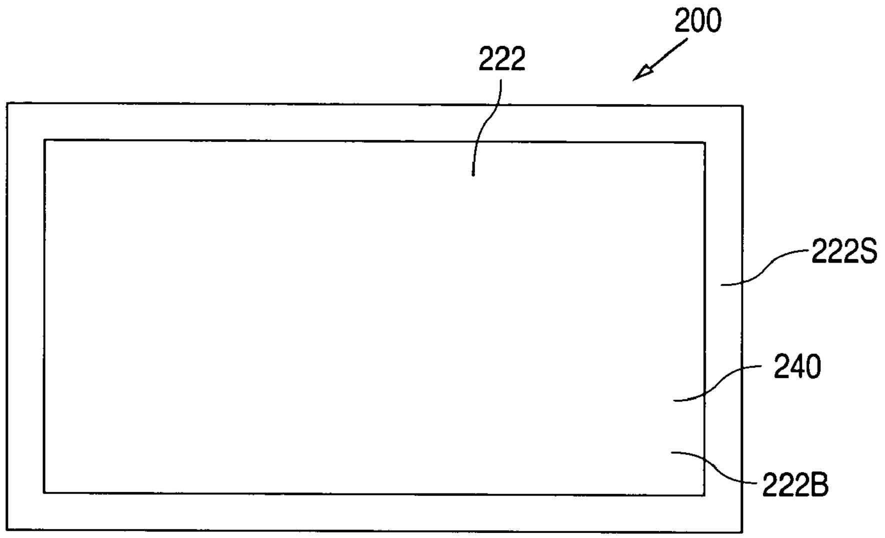
FIGS. 6A-6C are diagrams illustrating an example of a capacitive embodiment of MEMS microphone 200 in accordance with the present invention.
Figure 6B:
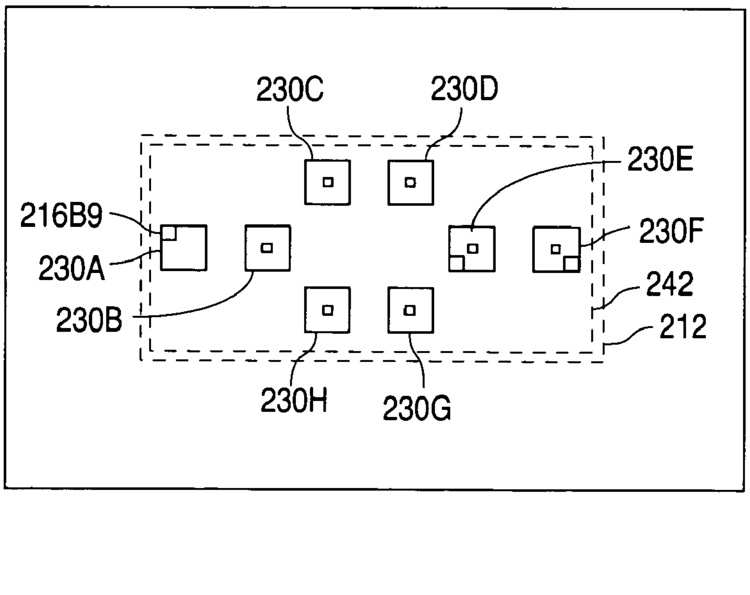
Figure 6C:
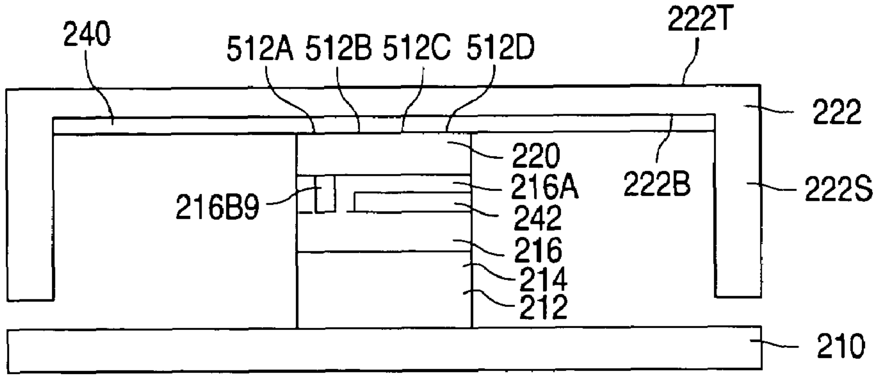

In addition, the present invention applies equally well to capacitive microphones. FIGS. 6A-6C show diagrams that illustrate an example of a capacitive embodiment of MEMS microphone 200 in accordance with the present invention. FIG. 6A shows a bottom view of package top 222, FIG. 6B shows a top view of interconnect structure 216, and FIG. 6C shows a cross-sectional view taken along line 2B-2B.

As shown in FIGS. 6A and 6C, MEMS microphone 200 includes a first conductive layer 240 that is connected to the bottom side 222B of package top 222. First conductive layer 240 can be implemented with, for example, a layer of conductive foil that has been bonded to the bottom side 222B of package top 222.

As shown in FIG. 6B, interconnect structure 216 can have one surface via 216B9, one conducting leaf spring 230A that is connected to surface via 216B9 and layer 240, and seven isolated leaf springs 230B, 230C, 230D, 230E, 230F, 230G, and 230H that are connected to top isolation layer 216A (and are therefore non-conducting) and layer 240. In addition, as shown in FIGS. 6B and 6C, a second conductive layer 242 lies below top isolation layer 216A.

In operation, the first and second conductive layers 240 and 242 function as the plates of a capacitor, while top isolation layer 216A and the air that lies between plates 240 and 242 functions as the dielectric. To begin operation, a voltage is placed on conductive layer 240. This can be accomplished in a number of ways, such as using a switch and conducting leaf spring 230A to place the voltage on conductive layer 240.

When the pressure changes due to incoming sound waves, the change in pressure causes package top 222 to vibrate.

The vibration causes the leaf springs 230A, 230B, 230C, 230D, 230E, 230F, 230G, and 230H to change position which changes the gap between the first and second plates 240 and 242 which, in turn, changes the capacitance across the first and second plates 240 and 242. The change in capacitance is detected and used to generate a signal that represents the incoming sound wave.

Figure 7A:
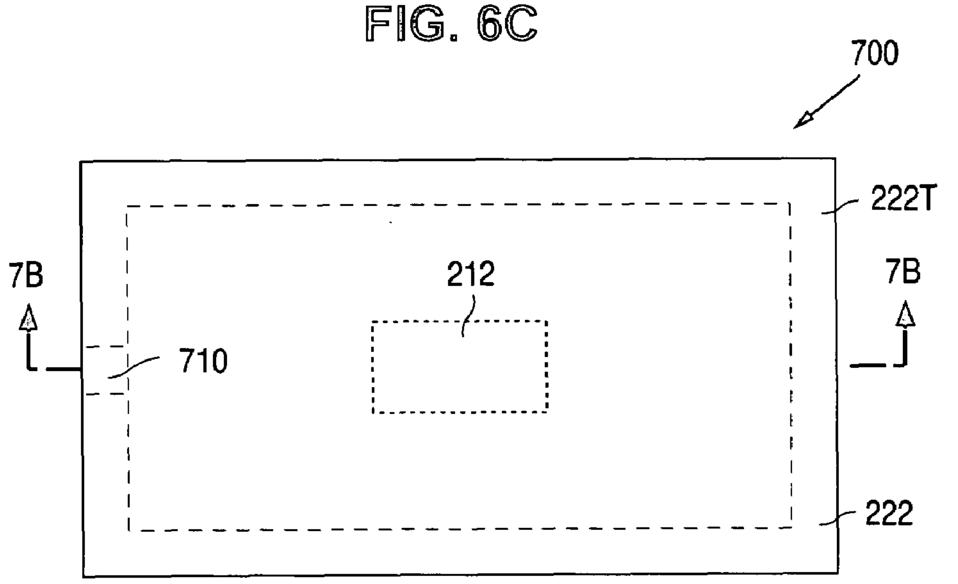
FIGS. 7A-7B are diagrams illustrating an example of a MEMS microphone 700 in accordance with the present invention.
Figure 7B:
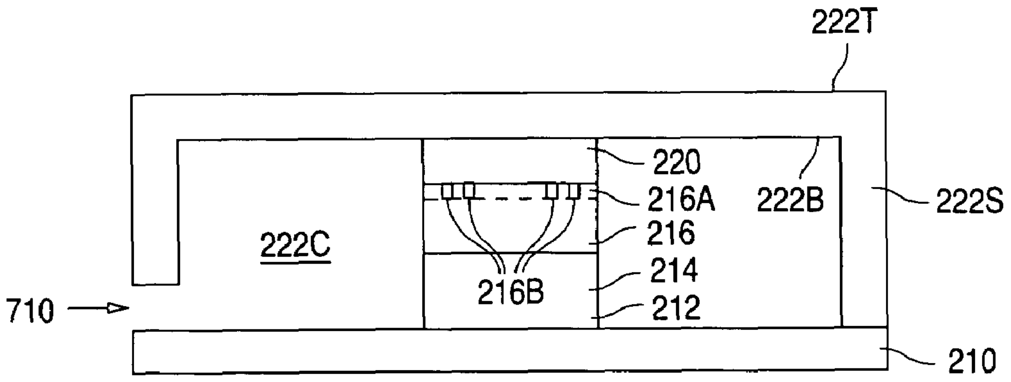

FIGS. 7A-7B show diagrams that illustrate an example of a MEMS microphone 700 in accordance with the present invention. FIG. 7A shows a plan view, while FIG. 7B shows a cross-sectional view taken along line 7B-7B of FIG. 7A. MEMS microphone 700 is similar to MEMS microphone 200 and, as a result, utilizes the same reference numerals to designate the structures which are common to both microphones.

As shown in FIGS. 7A and 7B, MEMS microphone 700 differs from MEMS microphone 200 in that MEMS microphone 700, with the exception of a pressure equalization port 710, is supported around the peripheral edge of the package. Thus, with the exception of port 710, the side walls 222S of package top 222 contact package bottom 210. As a result, the diaphragm of MEMS microphone 700 is stiffer than the diaphragm of MEMS microphone 200.

Pressure equalization port 710, in turn, is formed to control the speed with which the pressure within cavity 222C can be equalized with the surrounding pressure. For example, port 710 can be formed such that the pressure can not be equalized in less than 0.1 seconds (10 Hz). This can be achieved by making port 710 small enough, or forming an object within port 710 to restrict air flow.

It should be understood that the above descriptions are examples of the present invention, and that various alternatives of the invention described herein may be employed in practicing the invention. For example, the MEMS microphone of the present invention need not be formed with MOS transistors and an interconnect structure.

Alternately, the MEMS microphone of the present invention can be formed such that connector 220 contacts only top isolation layer 216A, and electrical connections are made between connector 220 and an external device (e.g., electrical traces can be run from the point where the leaf springs contact top isolation layer 216A to a point where an external device can be electrically connected). Thus, it is intended that the following claims define the scope of the invention and that structures and methods within the scope of these claims and their equivalents be covered thereby.

What is claimed is:

1. A micro-electromechanical system (MEMS) microphone comprising:
- a package base;
- a MEMS semiconductor die that is bonded to the package base, the MEMS semiconductor die having a semiconductor substrate and a top layer of isolation material that overlies the semiconductor substrate;
- a connector that contacts the top layer of isolation material, the connector being flexible, and including a piezoresistive material and a spring; and
- a package top that has a bottom side connected to the connector.

2. The MEMS microphone of claim 1 wherein the package top includes a plurality of conductive strips that contact a bottom side of the package top.

3. The MEMS microphone of claim 1 wherein the package top includes:
- a top surface; and
- side wall surfaces that extend away from the top surface, the side wall surfaces contacting the package bottom.

4. The MEMS microphone of claim 3 wherein a side wall surface includes a pressure equalization port.

5. A micro-electromechanical system (MEMS) microphone comprising:
- a base having a top surface, the top surface having a first region and a second region;
- a semiconductor die attached to the top surface of the base, the semiconductor die lying vertically over the first region of the top surface of the base, and not lying vertically over the second region of the top surface of the base;
- a connector that contacts the semiconductor die; and
- a member that contacts the connector, the member lying over both the first region and the second region of the top surface of the base.

6. The MEMS microphone of claim 5 wherein the member has a substantially planar top surface.

7. The MEMS microphone of claim 5 wherein the member is spaced apart from the base.

8. The MEMS microphone of claim 5 wherein the member includes a plurality of conductive strips that contact a bottom side of the member.

9. The MEMS microphone of claim 8 wherein the connector includes a number of elastically deformable piezo-responsive structures that contact the plurality of conductive strips.

10. The MEMS microphone of claim 5 wherein the connector includes a layer of piezo-responsive material that contacts the semiconductor die.

11. The MEMS microphone of claim 10 wherein the connector further includes a number of elastically deformable structures that contact the layer of piezo-responsive material and the bottom side of the member.

12. The MEMS microphone of claim 5 wherein the member includes a conductive region that contacts a bottom side of the member.

13. The MEMS microphone of claim 12 wherein the connector includes a number of elastically deformable structures that contact the conductive region.

14. The MEMS microphone of claim 5 wherein the connector includes a piezoelectric material.

15. A micro-electromechanical system (MEMS) microphone comprising:
- a semiconductor die having a top surface, the top surface having an area;
- a connector that contacts the semiconductor die, the connector being elastically deformable; and
- a member that contacts the connector, the member having a top surface, the top surface of the member having an area, the area of the top surface of the member being substantially larger than the area of the top surface of the semiconductor die.

16. The MEMS microphone of claim 15 wherein the member elastically deforms the connector in response to an external force applied to the member.

17. The MEMS microphone of claim 15 wherein the member is conductive.

18. The MEMS microphone of claim 15 wherein the member includes a plurality of conductive strips that contact a bottom side of the member.

19. The MEMS microphone of claim 15 wherein the member includes a conductive region that contacts a bottom side of the member.

* * * * *